United States Patent
Zhang et al.

(10) Patent No.: US 9,857,446 B2
(45) Date of Patent: Jan. 2, 2018

(54) ROBUST SELF-NAVIGATING MRI USING LARGE COIL ARRAYS

(71) Applicant: The Board of Trustees of the Leland Stanford Junior University, Palo Alto, CA (US)

(72) Inventors: Tao Zhang, Stanford, CA (US); John M. Pauly, Stanford, CA (US); Yuxin Chen, Stanford, CA (US); Joseph Y. Cheng, Stanford, CA (US); Shreyas S. Vasanawala, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 550 days.

(21) Appl. No.: 14/596,959

(22) Filed: Jan. 14, 2015

(65) Prior Publication Data

US 2016/0202339 A1    Jul. 14, 2016

(51) Int. Cl.
| | | |
|---|---|---|
| *G01R 33/565* | (2006.01) | |
| *G01R 33/3415* | (2006.01) | |
| *G01R 33/563* | (2006.01) | |
| *G01R 33/567* | (2006.01) | |

(52) U.S. Cl.
CPC .... *G01R 33/56509* (2013.01); *G01R 33/3415* (2013.01); *G01R 33/5676* (2013.01); *G01R 33/56316* (2013.01)

(58) Field of Classification Search
CPC .......... G01R 33/56509; G01R 33/3415; G01R 33/56316; G01R 33/5676
See application file for complete search history.

(56) References Cited

U.S. PATENT DOCUMENTS

| | | | |
|---|---|---|---|
| 7,692,423 B2 | 4/2010 | Cunningham et al. | |
| 7,834,623 B2 | 11/2010 | Iwadate et al. | |
| 7,945,079 B2 | 5/2011 | Rosen | |
| 8,306,299 B2* | 11/2012 | Samsonov | G01R 33/56509 |
| | | | 382/128 |
| 8,575,933 B2 | 11/2013 | Hu et al. | |
| 2011/0038520 A1* | 2/2011 | Yui | G01R 33/5676 |
| | | | 382/131 |
| 2014/0210469 A1* | 7/2014 | Cheng | G01R 33/56509 |
| | | | 324/309 |

OTHER PUBLICATIONS

Cheng et al., "Nonrigid Motion correction in 3D Using Autofocusing With Localized Linear Translations", Magnetic Resonance in Medicine; 68:1785-1797; 2012.

* cited by examiner

*Primary Examiner* — Gregory H Curran
(74) *Attorney, Agent, or Firm* — Beyer Law Group LLP

(57) ABSTRACT

A method for providing at least one motion corrected magnetic resonance imaging (MRI) image of an object in an MRI system with an array of a plurality of receiving coils is provided. At least one motion navigator signal of the object is provided. Individual navigator data are collected from each of the plurality of receiving coils. Motion estimates are generated for each of the plurality of receiving coils from the collected individual navigator data. A subset of the plurality of coils is found that detects a dominant motion by clustering the generated motion estimates. Only motion estimates from coils in the found subset are used to create a determined motion estimate. At least one MRI image is reconstructed using the determined motion estimate.

19 Claims, 7 Drawing Sheets

ROBUST SELF-NAVIGATING MRI USING LARGE COIL ARRAYS

GOVERNMENT RIGHTS

This invention was made with Government support under contracts EB009690 and P41 EE015891 awarded by the National Institutes of Health. The Government has certain rights in the invention.

BACKGROUND OF THE INVENTION

This invention relates generally to magnetic resonance imaging (MRI). More specifically, the invention relates to MRI with motion suppression or correction.

SUMMARY OF THE INVENTION

In accordance with the invention, a method for providing at least one motion corrected magnetic resonance imaging (MRI) image of an object in an MRI system with an array of a plurality of receiving coils is provided. At least one motion navigator signal of the object is provided. Individual navigator data are collected from each of the plurality of receiving coils. Motion estimates are generated for each of the plurality of receiving coils from the collected individual navigator data. A subset of the plurality of coils that detects a dominant motion is found by clustering the generated motion estimates. Only motion estimates from coils in the found subset are used to create a determined motion estimate. At least one MRI image is reconstructed using the determined motion estimate.

In another manifestation of the invention, a method for providing at least one motion corrected magnetic resonance imaging (MRI) image of an object in an MRI system with an array of a plurality of receiving coils is provided. At least one motion navigator signal of the object is provided. Individual navigator data are collected from each of the plurality of receiving coils. Motion estimates for each of the plurality of receiving coils are generated from the collected individual navigator data. A subset of the plurality of coils that detect a dominant motion is found by clustering the generated motion estimates, wherein the number of coils in the subset is less than half of a number of the plurality of receiving coils in the array. Only motion estimates from coils in the found subset are used to create a determined motion estimate. An MRI excitation of the object is provided. MRI image data are read out at the plurality of receiving coils. At least one MRI image is reconstructed using the determined motion estimate and MRI image data that are read out.

The invention and objects and features thereof will be more readily apparent from the following detailed description and appended claims when taken with the drawings.

DETAILED DESCRIPTION OF ILLUSTRATED EMBODIMENTS

Figure 1A:
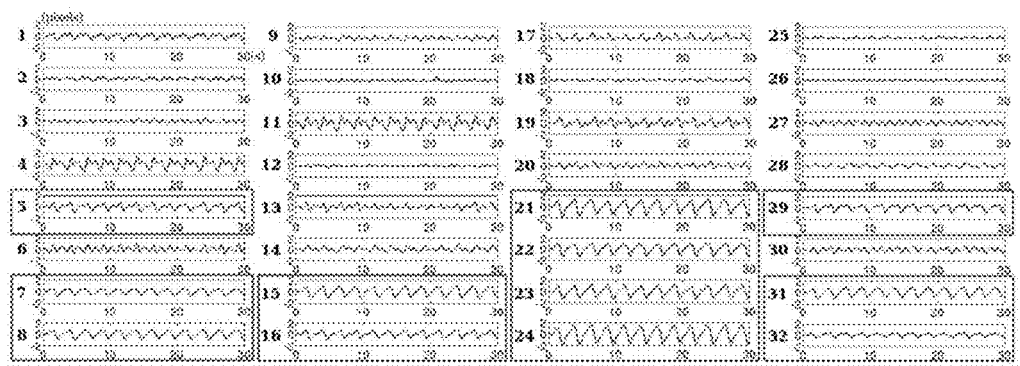
FIGS. 1a-c show an example of a free-breathing MR Urography study of a 2-year-old patient using a 32-channel coil array.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Magnetic Resonance Imaging (MRI) is a widely used medical imaging modality. It can provide excellent soft-tissue contrast, achieve volumetric coverage, and does not involve ionizing radiation like X-ray and Computed Tomography. One major challenge in MRI is motion. There is a wide range of sources for motion in MRI, including respiration, cardiac motion, peristalsis, blood flow, and voluntary patient movement. Motion can degrade image quality and create imaging artifacts, such as ghosting, blurring, reduced signal-to-noise ratio (SNR), et al. Breath-held acquisition can significantly reduce motion artifacts, but it is not usually practical when scan time exceeds 20 s, and sometimes when imaging non-cooperative patients, for example children.

Various motion compensation techniques have been developed. Motion compensation can be achieved both during MRI data acquisition and in the image reconstruction. In any case, motion must be accurately measured prior to motion compensation. Among various motion measurement techniques, motion tracking based on navigator is more flexible and has been widely used. The Butterfly technique is a self-navigating Cartesian trajectory. It can estimate translational motion with high temporal resolution during the prewinder gradient in Cartesian acquisition. With minor modification, the Butterfly technique can also track motion in three different axes for 3D Cartesian imaging. Motion compensation based on the Butterfly technique has been demonstrated in a clinical setting in previous studies.

For MRI with large coil arrays, each coil has localized sensitivity. The Butterfly navigator from individual coils can track the translational motion at different image regions. The navigator from all coils is usually averaged first as the estimated motion prior to motion compensation. This is effective when there is only one type of dominant motion. However, when multiple types of motion occur during data acquisition, Butterfly navigators from different coils vary and can potentially track different types of motion within local regions.

Therefore, averaging over all the coils can lead to incorrect motion estimation, and thus ineffective motion compensation.

An embodiment of the invention provides a robust navigator processing method for large coil arrays. A coil clustering technique is developed to automatically select the dominant motion within the imaging volume. The selected coil cluster provides an accurate measurement of the dominant motion. The embodiment is validated in both pediatric and adult patient studies with a wide range of clinical applications, including 3D abdominal and pelvic dynamic contrast-enhanced (DCE) MRI, 3D MR Urography (MRU), and 3D volumetric phase-contrast cardiac MRI (4DFlow).

Robust Navigator Processing Using Coil Clustering Example

In this example, the Butterfly technique is applied to acquire motion navigators. The Butterfly technique is a modification of the Cartesian trajectory, with the pre-winder gradients for phase encodes traversing the same trajectory at the beginning of each data acquisition. It provides a translational motion estimate with negligible time penalty. A detailed description of Butterfly is described in Cheng J, Alley M, Cunningham C, Vasanawala S, Pauly J, Lustig M., "Nonrigid motion correction in 3D using autofocusing with localized linear translations", Magn Reson Med 2012; 68:1785-1797, which is incorporated by reference for all purposes. For MRI data acquisition with large coil arrays, the navigator from individual coil only tracks motion within the local region.

Figure 1B:
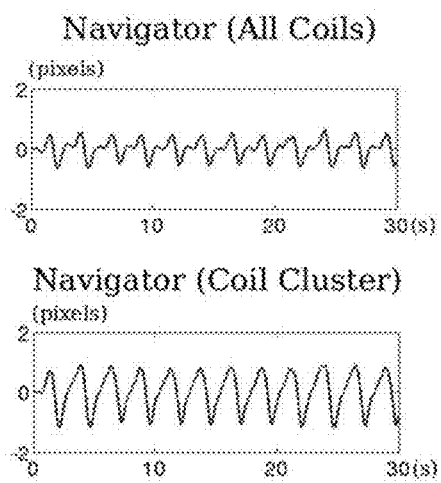
Figure 1C:
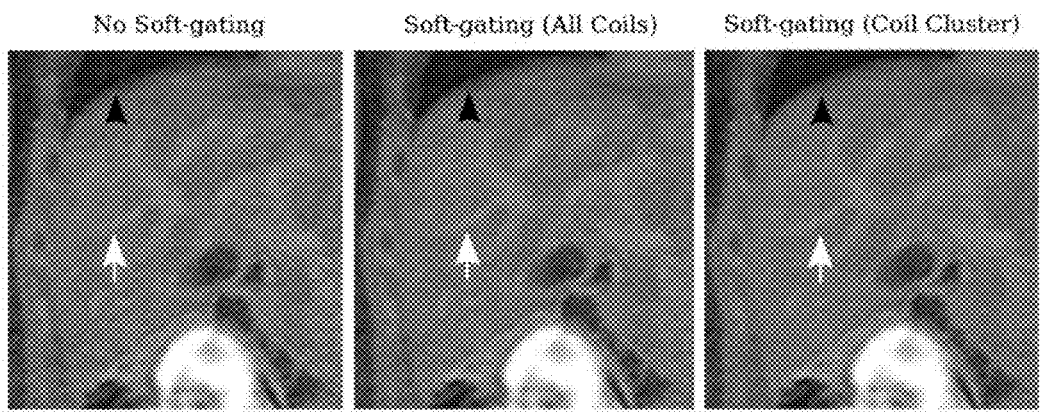

FIGS. 1a-c show an example of a free-breathing MR Urography study of a 2-year-old patient using a 32-channel coil array. As an example, the navigator in superior/inferior (S/I) direction from a 32-channel coil in an MRU study of a 2-year-old patient is shown in FIG. 1(a). Usually in body MRI or abdominal MRI, respiration is the dominant motion. However, the individual navigator may also track other types of motion (e.g., cardiac motion, peristalsis) combined with respiration. Here, the measured respiratory waveforms vary within the coil arrays. When all the coils are considered, the averaged navigator is shown in FIG. 1(b) top. The estimated motion no longer represents solely the respiration. However, if only a subset of the coils (boxed in FIG. 1(a)) is chosen, the averaged navigator within the coil subset can represent the dominant respiration (shown in FIG. 1(b) bottom). This coil subset is termed a coil cluster for the rest of this work. As an example, soft-gating (5, 9, 10) is performed on this dataset as the motion compensation technique. The results without and with soft-gating are shown in FIG. 1(c). Note that compared to the soft-gated reconstruction using the averaged navigator within the coil cluster, there are residual motion artifacts when inaccurate navigator (averaged over all coils) is applied for motion compensation. In this example using the locally low-rank parallel imaging reconstruction without soft-gating (left), with soft-gating using the averaged navigator from all coils (middle), and with soft-gating using the averaged navigator within the coil cluster (right) are compared. Note the improvement of image quality and structural delineation (arrows) by soft-gating with the robust navigator processing using coil clustering.

Figure 2A:
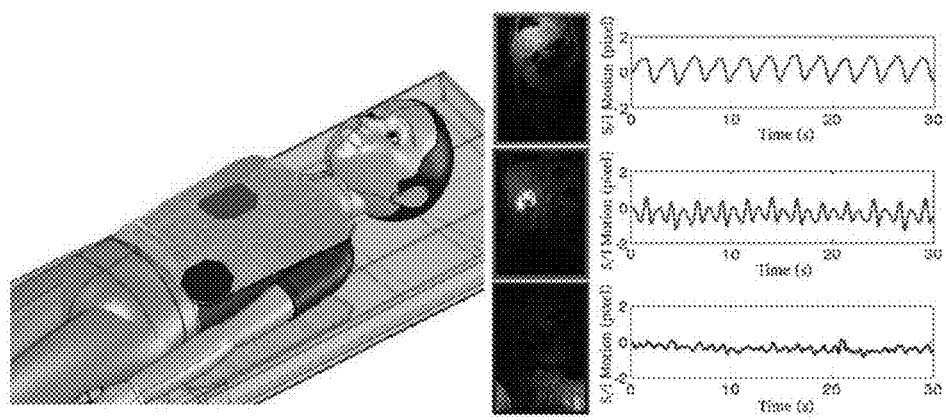
FIGS. 2a-d demonstrate a robust navigator processing using spectral clustering.
Figures 2B, 2C, 2D:
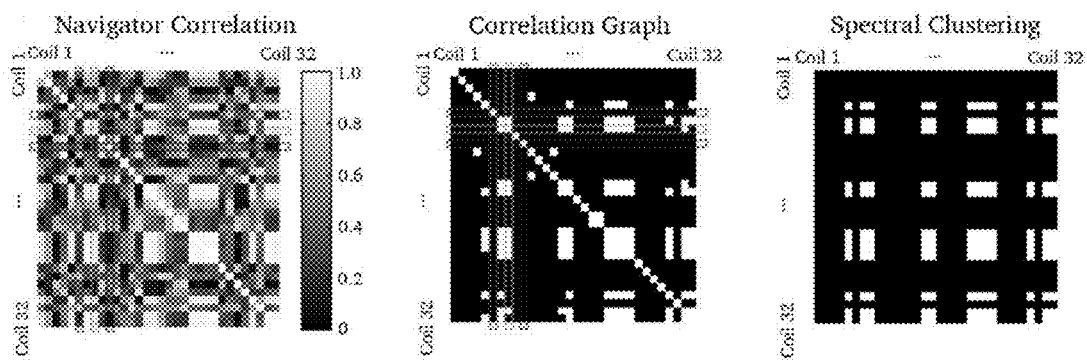

FIGS. 2a-d demonstrate a robust navigator processing using spectral clustering. FIG. 2a illustrates examples of S/I Butterfly navigators measured by three different coils from a 32-channel coil array during a free-breathing MRU study. Note that the top navigator resembles respiration while the other two coils could not measure accurately the respiration due to localized coil sensitivity or other physiological motion corruption (peristalsis, cardiac motion, etc). FIG. 2b illustrates normalized correlation matrix of the navigator signals from all coils. FIG. 2c illustrates navigator correlation graph constructed from the navigator correlation matrix of FIG. 2b. Only the highly correlated navigator pairs in the correlation matrix are selected as a node in the correlation graph. Note that the eighth coil is highly correlated with several other coils. FIG. 2d illustrates the approximated correlation graph within the coil cluster: after spectral clustering, only a subset of the coils in the coil arrays is selected. Within the coil cluster, any two navigator pairs are highly correlated.

To automatically find out the coil cluster that represents the dominant respiratory motion, a spectral clustering technique is applied. Assume that there is one dominant motion within the entire imaging volume (usually respiration), and this dominant motion is measured by multiple coils. Define S the coil cluster, $d_i$ the navigator signal from coil i, and N the total number of coils used for data acquisition. Then the problem of finding the coil cluster that represents the dominant motion can be equivalently formulated as:

$$\underset{S\subset\{1,2,\ldots,N\}}{\text{maximize}} \quad |S| \quad (1)$$

$$\text{subject to } |\rho(d_i, d_j)| > t_1, \forall i, j \in S$$

where $|S|$ is the number of coils (or cardinality) of the coil cluster, $\rho(d_i, d_j)$ is the correlation coefficient (range from −1 to 1) between the navigators from coil i and coil j, and $t_1$ is the threshold of the correlation coefficient (e.g., $t_1$=0.9).

Spectral clustering is proposed to solve this problem. The major steps in the spectral clustering algorithm are listed below:

1. Calculation of the navigator correlation matrix C, where $C(i, j)=\rho(d_i, d_j)$, $\forall i, j \in \{1, 2, \ldots, N\}$. An example of the navigator correlation matrix is shown in FIG. 2 (b).

2. Construct the correlation graph G. This step requires an entry-wise thresholding operation (shown in FIG. 2(c)).

$$G(i, j) = \begin{cases} 1, & \text{if } |C(i, j)| \geq t_1 \\ 0, & \text{otherwise} \end{cases} \quad (2)$$

Ideally the rank of the correlation graph within the final coil cluster should be 1 (shown in FIG. 2(d)).

3. Eigenvalue decomposition of the correlation graph G (shown in FIG. 3).

$$G=USU^T \quad (3)$$

Figure 3:
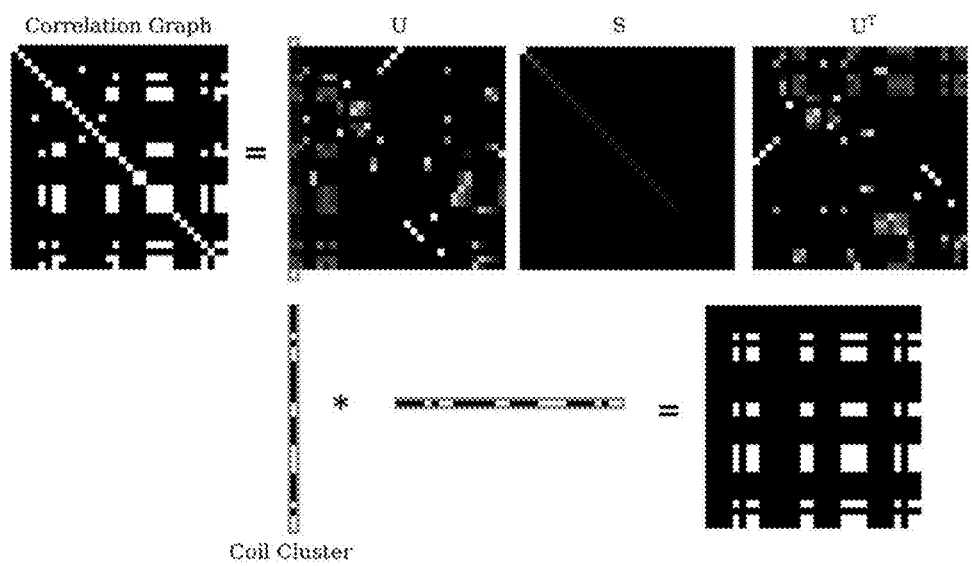
FIG. 3 demonstrates the spectral clustering algorithm.

FIG. 3 demonstrates the spectral clustering algorithm. First, eigenvalue decomposition is performed on the correlation graph. The eigenvalues in matrix S decrease dramatically, which represents the low-rank property of the correlation graph. The coil cluster can be found by thresholding of this eigenvector and taking only the non-zero entries.

Coil clustering based on the first eigenvector. Note that the first eigenvector in U (highlighted in FIG. 3) only has a few non-zero entries. This essentially represents the support of the coil cluster. Define $u_1$ as the first eigenvector of G. The coil cluster can be found by another thresholding operation:

$$\begin{cases} \text{if } |u_1(i)| \geq t_2, i \in S \\ \text{if } |u_1(i)| < t_2, i \notin S \end{cases} \forall i \in \{1, 2, \ldots, N\} \quad (4)$$

where $t_2$ is the threshold for the eigenvector $u_1$ (e.g., $t_2$=0.1).

After these steps, S is the resulting coil cluster that captures the dominant motion. Therefore, the dominant motion can be represented by an averaging of the navigators within the coil cluster. Note that sometimes the navigators within the coil cluster can be negatively correlated. That is, the navigators from two different coils can track translational motion in the opposite directions (for example, right/left expansion). Therefore, some navigators may need to be aligned with others (by multiplying −1) before the averaging, so that translational motion from the opposite directions does not cancel out. An example of the selected navigators within the coil cluster is highlighted in FIG. 1(a).

For abdominal MRI, S/I navigator usually best represents respiration. However, translational motion in anterior/posterior (A/P) and right/left (R/L) can also be observed in abdominal MRI, especially in lower abdomen. For 3D MRI, Butterfly can track motion in all three axes, therefore motion in all directions can be combined using the following steps.

1. Apply the previously described spectral clustering method along each axis separately and calculate the averaged navigators within the coil cluster in all axes. Define $d^x$, $d^y$, and $d^z$ the estimated motion in x, y, and z direction respectively.

2. Set $d^x$, $d^y$, or $d^z$ to zero if the number of coils within the coil cluster is less than three. When the coil cluster is too small, the estimated motion is not reliable and should be ignored.

3. Combine estimated motion from all axes by $d=\sqrt{(d^x)^2+(d^y)^2+(d^z)^2}$, where d is defined the combined motion.

Experiments and Results

Different embodiments of MRI applications including 3D MRU, 3D abdominal and pelvic DCE MRI, and 4DFlow, were tested on a 3T GE MR750 scanner. The number of coils used in different studies varied from 16 to 32 channels. Soft-gated locally low-rank reconstruction was applied to all datasets for image reconstruction.

The first example of a free-breathing MRU study is shown in FIGS. 1a-c. Soft-gating motion compensation based on the motion estimation from the coil cluster significantly reduced the motion artifacts. It provided the best image quality compared to images without motion compensation and images with soft-gating based on inaccurate estimated motion.

Figure 4A:
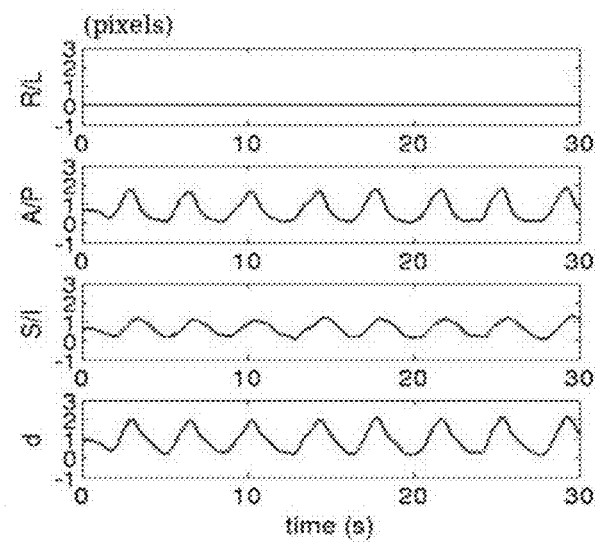
FIGS. 4a-c illustrate another example of a free-breathing dynamic contrast-enhanced MRI study.
Figure 4B:
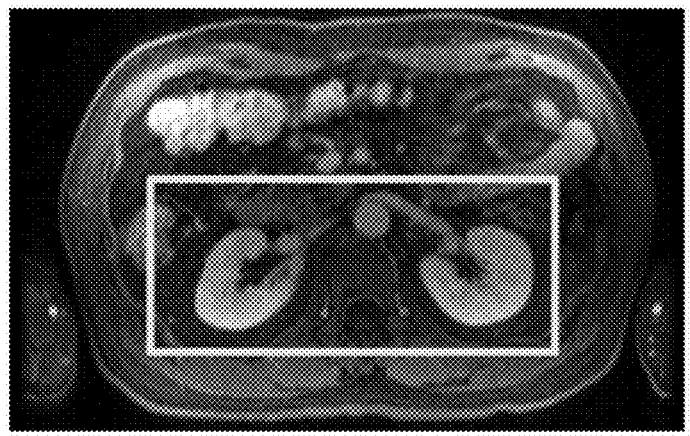
Figure 4C:
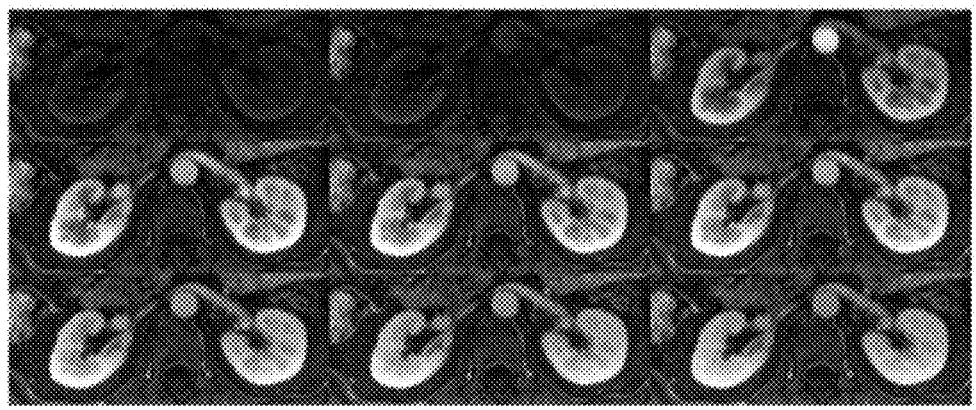

Another example of a free-breathing DCE MRI study is shown in FIGS. 4a-c, which is of a 68-year-old patient and uses a soft-gated locally low-rank parallel imaging reconstruction with robust Butterfly navigator processing. FIG. 4a shows the estimated respiratory motion in R/L, A/P, and S/I directions respectively. Note that the R/L navigators do not have a common mode (largest coil cluster has only two coils), therefore R/L motion is set to zero. For this patient, the dominant motion is in the A/P direction. FIG. 4b shows an example of the reconstructed post-contrast image. No obvious motion artifacts were observed. FIG. 4c shows the contrast dynamics in the zoomed and cropped region (highlighted in FIG. 4b), which reflects the achieved high spatiotemporal resolution of the acquisition. With the proposed navigator processing method, reasonable motion estimation in all three axes has been achieved. Since free-breathing acquisition was enabled, the rapid contrast enhancement dynamics was captured and demonstrated in FIG. 4c.

Figure 5A:
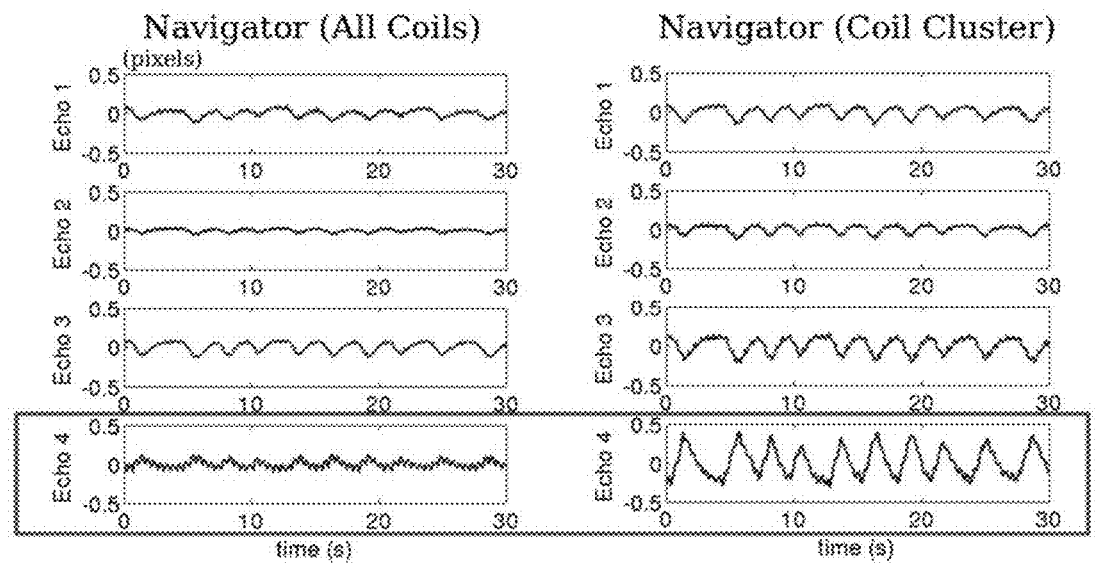
FIGS. 5a-b show an example of a free-breathing 3D phase-contrast cardiac MRI study of a 22-year-old patient using soft-gated locally low-rank parallel imaging reconstruction with robust Butterfly navigator processing.
Figure 5B:
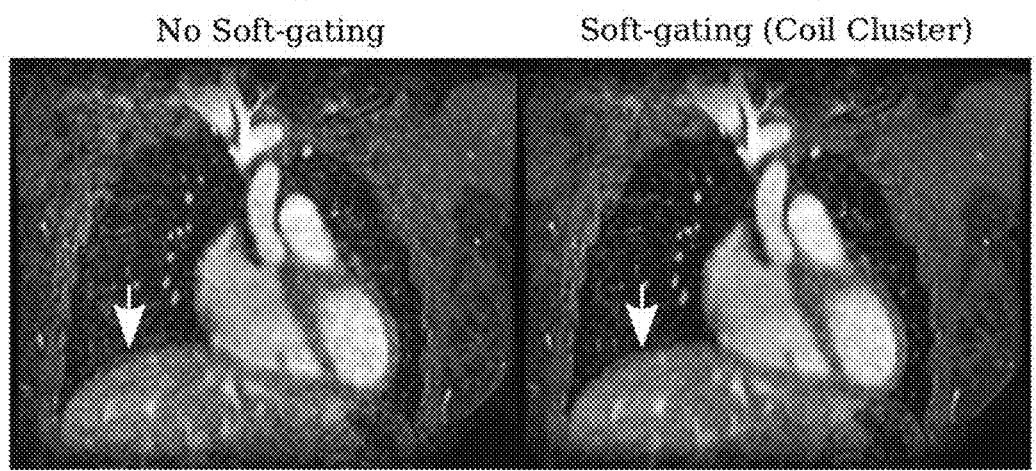

FIGS. 5a-b show an example of a free-breathing 4DFlow study of a 22-year-old patient using soft-gated locally low-rank parallel imaging reconstruction with robust Butterfly navigator processing. FIG. 5a shows the estimated motion from all the coils and from only the coil cluster along all four flow encoding directions respectively. Note that the estimated motion is along four arbitrary directions depending on the flow encoding gradients (not A/P, R/L or S/I). The averaged motion from the coil cluster is close to respiration, while the averaged motion from all coils is corrupted by cardiac motion. This is most obvious in the fourth echo (highlighted by the box). FIG. 5b shows a locally low-rank reconstruction without soft-gating (left) and with soft-gating using navigator within the coil cluster. The proposed navigator processing with coil clustering better captured the respiration. Similar to previous examples, soft-gating motion compensation with the proposed method significantly reduced motion artifacts and improved the image quality.

Figure 6:
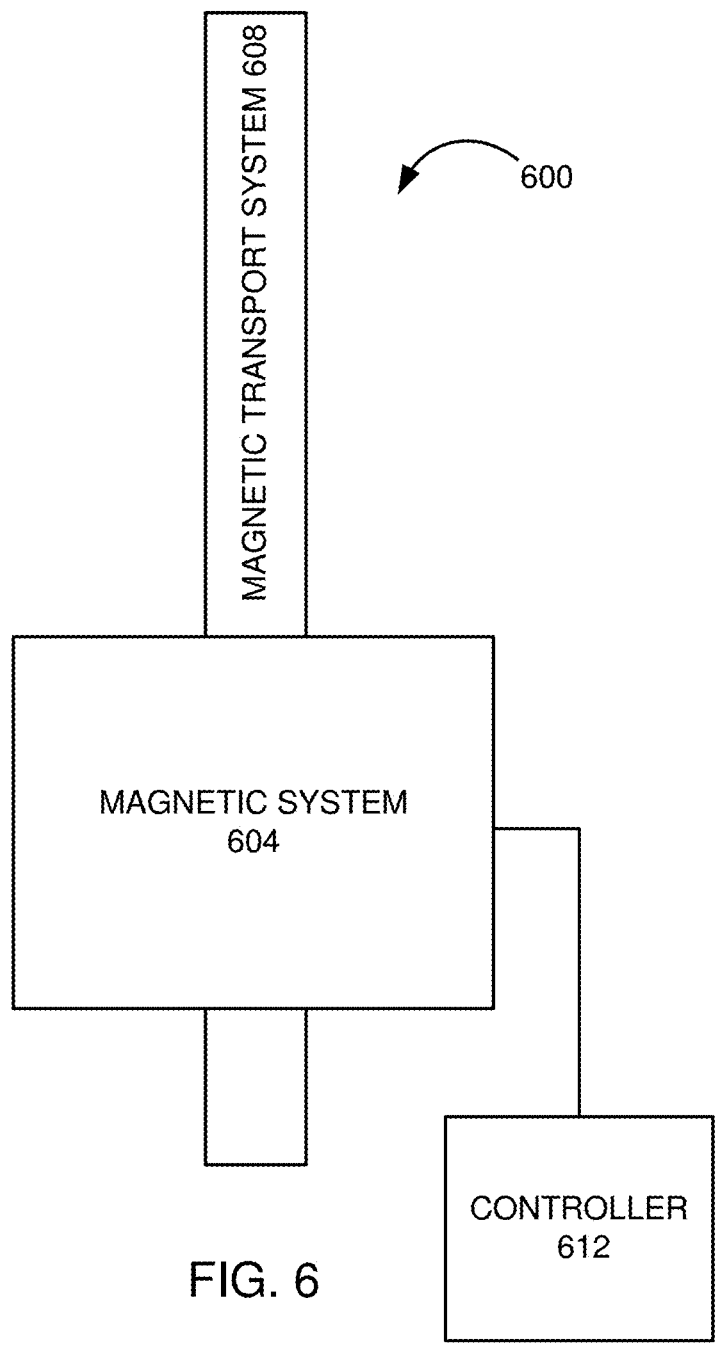
FIG. 6 is a schematic top view of a magnetic resonance imaging (MRI) system that may be used in an embodiment of the invention.

To further facilitate understanding of the invention, FIG. 6 is a schematic top view of a magnetic resonance imaging (MRI) system 600 that may be used in an embodiment of the invention. The MRI system 600 comprises a magnet system 604, a patient transport system 608 connected to the magnet system, and a controller 612 controllably connected to the magnet system. In one example, a patient (subject) would lie on the patient transport table 608 and the magnet system 604 would pass around the patient. The controller 612 would control magnetic fields and radio frequency (RF) signals provided by the magnet system 604 and would receive signals from detectors in the magnet system 604.

Figure 7:
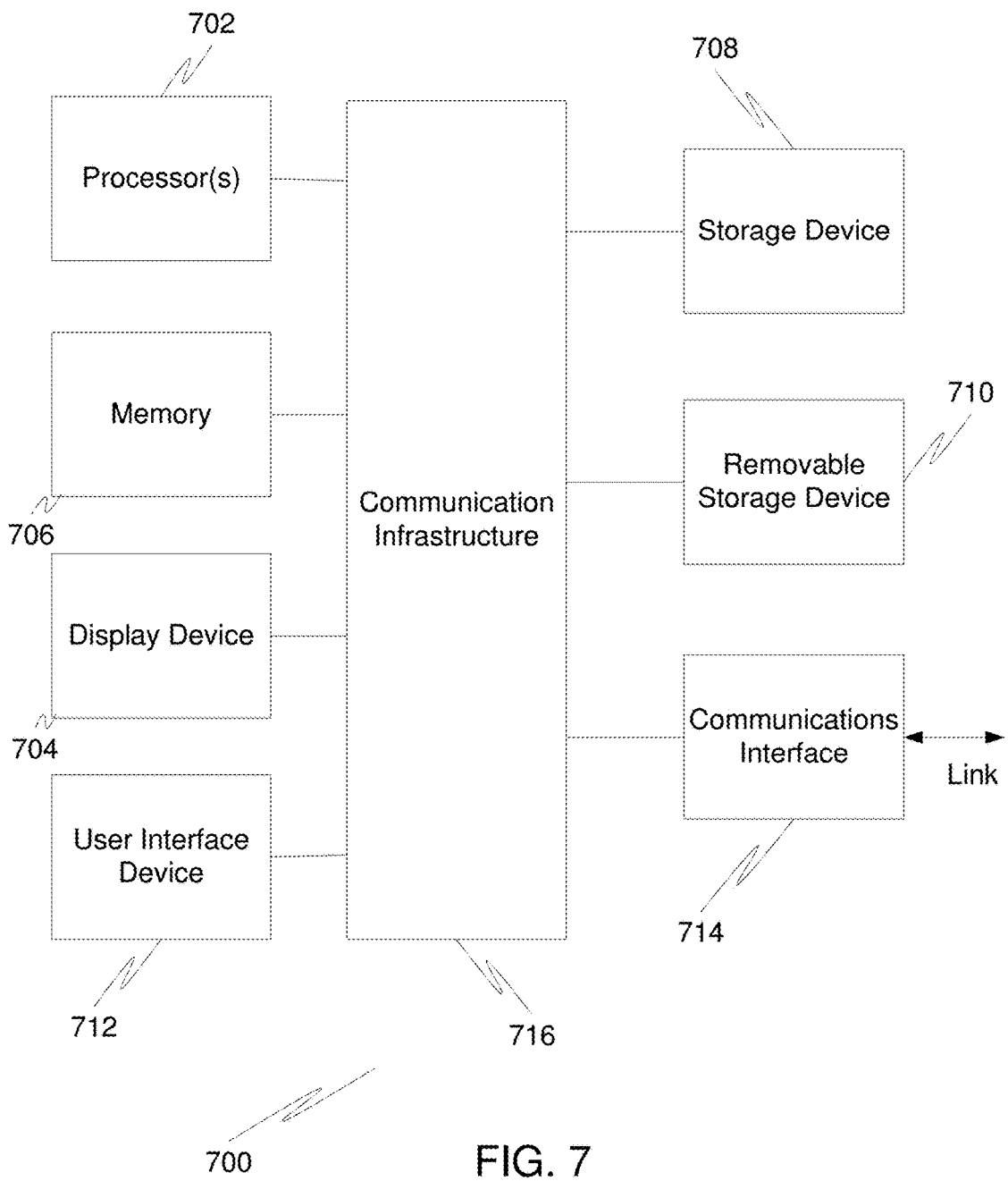
FIG. 7 is a high level block diagram showing a computer system.

FIG. 7 is a high level block diagram showing a computer system 700, which is suitable for implementing the controller 612 used in embodiments of the present invention. The computer system may have many physical forms ranging from an integrated circuit, a printed circuit board, and a small handheld device up to a super computer. The computer system 700 includes one or more processors 702, and further can include an electronic display device 704 (for displaying graphics, text, and other data), a main memory 706 (e.g., random access memory (RAM)), storage device 708 (e.g., hard disk drive), removable storage device 710 (e.g., optical disk drive), user interface devices 712 (e.g., keyboards, touch screens, keypads, mice or other pointing devices, etc.), and a communication interface 714 (e.g., wireless network interface). The communication interface 714 allows software and data to be transferred between the computer system 700 and external devices via a link. The system may also include a communications infrastructure 716 (e.g., a communications bus, cross-over bar, or network) to which the aforementioned devices/modules are connected.

Information transferred via communications interface 714 may be in the form of signals such as electronic, electromagnetic, optical, or other signals capable of being received by communications interface 714, via a communication link that carries signals and may be implemented using wire or cable, fiber optics, a phone line, a cellular phone link, a radio frequency link, and/or other communication channels. With such a communications interface, it is contemplated that the one or more processors 702 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 8:
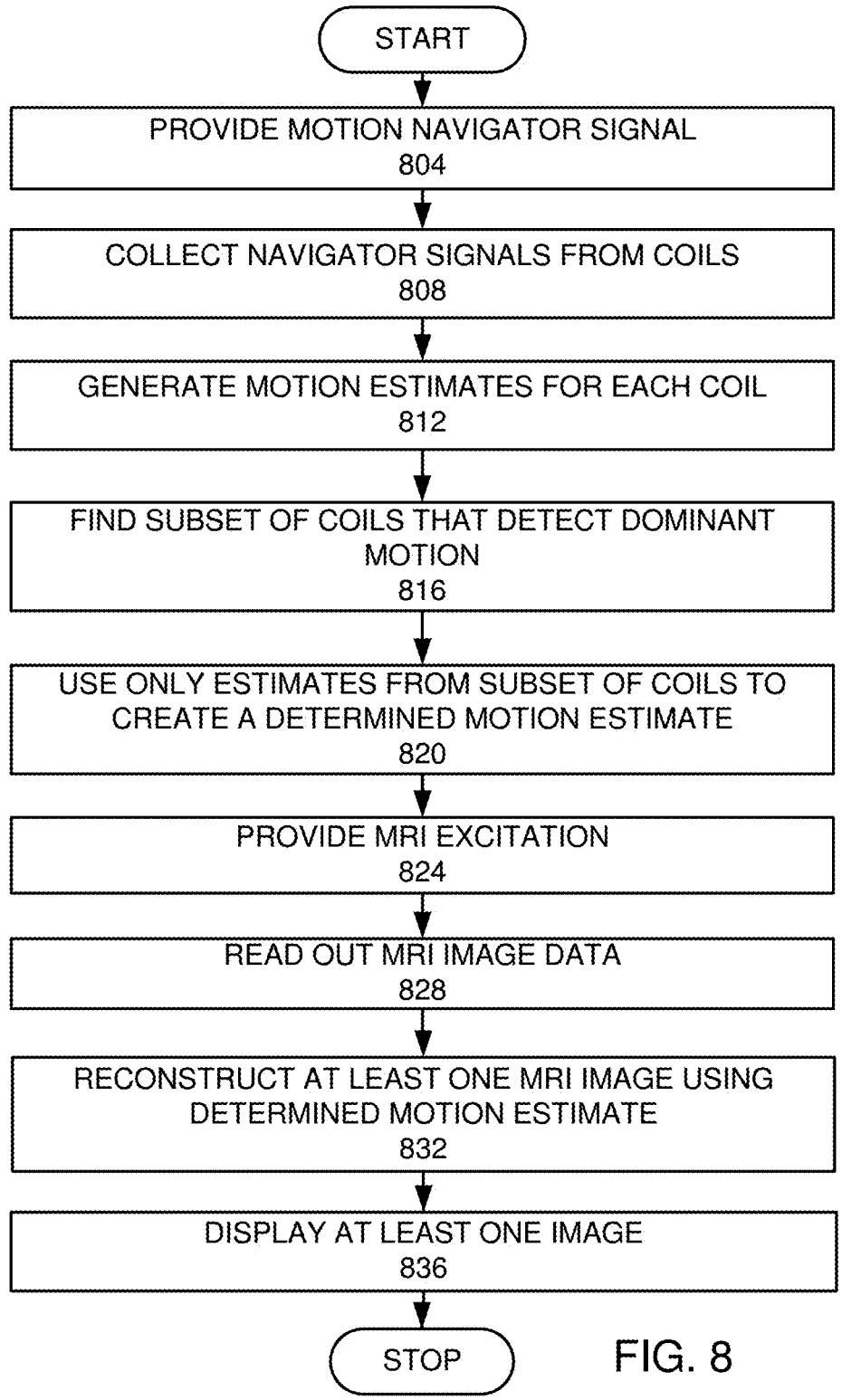
FIG. 8 is a flow chart of a process used in an embodiment of the invention.

FIG. 8 is a flow chart of a process used in an embodiment of the invention. For a subject placed in the MRI system 600, a navigation signal is provided to the subject (step 804). Individual navigator signals are collected from each of the plurality of receiving coils (step 808). Motion estimates are generated for each of the plurality of receiving coils (step 812). A subset of the plurality of coils is found that detects a dominant motion (step 816). Only motion estimates from the subset of the plurality of coils are used to determine a motion estimate (step 820). An MRI excitation is provided (step 824). In some embodiments, the MRI acquisition is provided with that navigation signal. In other embodiments, the MRI acquisition is provided at a different time than providing the navigation signal. MRI image data is read out by each of the plurality of coils (step 828). At least one MRI image is reconstructed using the determined motion estimate (step 832). The at least one MRI image is displayed (step 836).

Various motion compensation methods have been proposed. The efficacy of any motion compensation highly depends on the accuracy of the motion measurement prior to motion compensation. Embodiments of the invention provide a robust way to achieve motion estimation with large coil arrays, and have several advantages compared to existing methods.

First, some embodiments use the self-navigating Cartesian trajectory—Butterfly. Therefore, no extra motion tracking devices (e.g., respiratory bellows) are required. This process also saves time for patient preparation, such as calibrating or positioning the extra motion tracking devices.

Second, some embodiments can estimate the dominant motion within a large imaging volume, even when multiple types of motion are present. The proposed method also tracks motion along all imaging directions, and is therefore insensitive to patient positioning and acquisition orientation.

The combination of these advantages makes completely free-breathing acquisition possible and increases the scan efficiency to close to 100%. Free-breathing acquisition can improve the spatiotemporal resolution for dynamic MRI. It can potentially reduce or completely remove general anesthesia in pediatric MRI.

The previous embodiments have been demonstrated in 3D Cartesian acquisition. There are other embodiments that may be useful. First, the main assumption of some of the above embodiments is the localized motion estimation from large coil arrays. Therefore proposed method also applies to non-Cartesian trajectory, for example, radial or spiral trajectory. Second, besides the Butterfly technique, the proposed coil clustering method can also be applied when other types of navigation methods are used, for example, coil-by-coil image navigator. Further, when multiple external motion tracking sensors are used, the proposed method can also be applied. Third, when there is more than one dominant motion within the imaging volume, the proposed method can be applied more than once. For each coil clustering step, one type of motion is estimated, and the coil cluster can be removed from the original coil arrays. After that, when coil clustering is applied again, another type of motion can potentially be estimated. Fourth, the proposed coil clustering technique can also be applied to coil decoupling. Instead of calculating the navigator correlation, noise covariance matrix can be used. This may be helpful to analyze and design coil arrays. Last but not least, although only the soft-gating motion compensation is demonstrated in this work, other embodiments can be combined with most motion compensation techniques.

Various embodiments mainly incorporate some of the following novel features. A self-navigating Cartesian trajectory with large coil arrays can remove the need for extra motion tracking devices; A robust motion estimation technique that is insensitive to other types of motion corruption within a large imaging volume; A completely free-breathing data acquisition is provided that can improve the scan efficiency to close to 100%. Embodiments of the invention are robust and very easy to implement. The only requirement is a motion tracking method (e.g., Butterfly) and the use of large coil arrays.

Therefore embodiments of the invention with a robust motion navigator processing method using coil clustering have been described. Some embodiments automatically estimate the dominant motion within a large imaging volume. Some embodiments allow completely free-breathing acquisition, improve the scan efficiency, and achieve high spatiotemporal resolution for dynamic MRI.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for providing at least one motion corrected magnetic resonance imaging (MRI) image of an object in an MRI system with an array of a plurality of receiving coils, comprising:
    providing at least one motion navigator signal of the object;
    collecting individual navigator data from each of the plurality of receiving coils;
    generating motion estimates for each of the plurality of receiving coils from the collected individual navigator data;
    finding a subset of the plurality of coils that detect a dominant motion by clustering the generated motion estimates;
    using only motion estimates from coils in the found subset to create a determined motion estimate; and
    reconstructing at least one MRI image using the determined motion estimate.

2. The method, as recited in claim 1, further comprising:
    providing an MRI excitation of the object;
    reading out MRI image data at the plurality of receiving coils, wherein the reconstructing at least one MRI image uses the MRI image data.

3. The method, as recited in claim 2, wherein a number of coils in the found subset is less than half a number of the plurality of coils in the array.

4. The method, as recited in claim 3, wherein the reconstructing at least one MRI image creates a plurality of motion-resolved images.

5. The method, as recited in claim 3, wherein the reconstructing at least one MRI image creates at least one motion-corrected image.

6. The method, as recited in claim 3, wherein the clustering the generated motion estimates, comprises finding clusters on each axis of a 3D MRI acquisition, and wherein the using the motion estimates comprises averaging the motion estimates in each cluster.

7. The method, as recited in claim 3, wherein the using the motion estimates, comprise averaging the motion estimates in a cluster.

8. The method as recited in claim 3, wherein the using the motion estimates, comprises using a weighted linear combination of the motion estimates.

9. The method, as recited in claim 3, wherein the providing the at least one navigator signal of the object and providing the MRI excitation of the object occur simultaneously.

10. The method, as recited in claim 3, wherein the providing at last one navigator signal of the object and the providing the MRI excitation, comprises providing a translational motion signal.

11. The method, as recited in claim 3, wherein the plurality of coils of the array is at least 8 coils.

12. The method, as recited in claim 2, wherein the providing the at least one navigator signal of the object and providing the MRI data acquisition of the object occur simultaneously after an MRI excitation.

13. The method, as recited in claim 1, wherein a number of coils in the found subset is less than half a number of the plurality of coils in the array.

14. The method, as recited in claim 1, wherein the reconstructing at least one MRI image creates a plurality of motion-resolved images.

15. The method, as recited in claim 1, wherein the reconstructing at least one MRI image creates at least one motion-corrected image.

16. The method, as recited in claim 1, wherein the clustering the generated motion estimates, comprises finding clusters on each axis of a 3D MRI acquisition, and wherein the using the motion estimates comprises averaging the motion estimates in each cluster.

17. The method, as recited in claim 1, wherein the providing at last one navigator signal of the object and the providing the MRI excitation, comprises providing a translational motion signal.

18. The method, as recited in claim 1, wherein the plurality of coils of the array is at least 8 coils.

19. A method for providing at least one motion corrected magnetic resonance imaging (MRI) image of an object in an MRI system with an array of a plurality of receiving coils, comprising:
provide at least one motion navigator signal of the object;
collecting individual navigator data from each of the plurality of receiving coils;
generating motion estimates for each of the plurality of receiving coils from the collected individual navigator data;
finding a subset of the plurality of coils that detect a dominant motion by clustering the generated motion estimates, wherein the number of coils in the subset is less than half of a number of the plurality of receiving coils in the array;
using only motion estimates from coils in the subset to create a determined motion estimate;
providing an MRI excitation of the object;
reading out MRI image data at the plurality of receiving coils; and
reconstructing at least one MRI image using the determined motion estimate and the readout MRI data.

* * * * *